United States Patent
Blanco Barro et al.

(10) Patent No.: US 8,283,109 B2
(45) Date of Patent: Oct. 9, 2012

(54) METHOD FOR OBTAINING MICROFLUIDIC POLYMER STRUCTURES

(75) Inventors: Francisco Javier Blanco Barro, Mondragon (ES); Jorge Elizalde Garcia, Mondragon (ES); Jesús Miguel Ruano Lopez, Mondragon (ES)

(73) Assignee: Ikerlan Centro de Investigaciones Tecnologias, S. Coop., Mondragon, Guipuzcoa (ES)

( * ) Notice: Subject to any disclaimer, the term of this patent is extended or adjusted under 35 U.S.C. 154(b) by 498 days.

(21) Appl. No.: 12/160,638

(22) PCT Filed: Jan. 12, 2007

(86) PCT No.: PCT/ES2007/000011
§ 371 (c)(1),
(2), (4) Date: Mar. 30, 2010

(87) PCT Pub. No.: WO2007/080206
PCT Pub. Date: Jul. 19, 2007

(65) Prior Publication Data
US 2010/0196830 A1    Aug. 5, 2010

(30) Foreign Application Priority Data
Jan. 12, 2006    (ES) .................................. 200600071

(51) Int. Cl.
*G03F 7/20*    (2006.01)
(52) U.S. Cl. ........................................ 430/320; 430/330
(58) Field of Classification Search .................. None
See application file for complete search history.

(56) References Cited

U.S. PATENT DOCUMENTS

| 4,882,245 | A | 11/1989 | Gelorme et al. |
| 6,123,798 | A | 9/2000 | Gandhi et al. |
| 2002/0053399 | A1* | 5/2002 | Soane et al. ................... 156/292 |
| 2006/0014271 | A1 | 1/2006 | Song et al. |
| 2006/0078470 | A1* | 4/2006 | Zhou et al. ..................... 422/100 |
| 2006/0272716 | A1* | 12/2006 | Hawkins et al. ............... 137/833 |

OTHER PUBLICATIONS

Pan et al. "A low-temperature wafer bonding technique using patternable materials." *J. Micromech. M.icroeng. vol. 12.* 2002. pp. 611-615.
Bilenberg et al. "PMMA to SU-8 bonding for polymer based lab-on-a-chip systems with integrated optics." *J. Micromech. M.icroeng. vol. 14.* 2004. pp. 814-818.
Jackman et al. "Microfluidic systems with on-line UV detection fabricated in photodefinable epoxy." *J. Micromech. M.icroeng.vol. 11.* 2001. pp. 263-269.
Ruano-Lopez et al. A new SU-8 process to integrate buried waveguides and sealed microchannels for a Lab-on-a-Chip.: *Sensors and Actuators. vol. 114.* 2006. pp. 542-551.
Blanco et al. "Novel three-dimensional embedded SU-8 microchannels fabricated using a low temperature full wafer adhesive bonding." *J. Micromech. Microeng. vol. 14.* 2004. pp. 1047-1056.
Becker et al. "Polymer microfluidic devices." *Talanta. vol. 56.* 2002. pp. 267-287.
Reyes et al. "Micro Total Analysis Systems. 1. Introduction, Theory, and Technology." *Anal. Chem. vol. 74.* 2002. pp. 2623-2636.

\* cited by examiner

*Primary Examiner* — John A. McPherson
(74) *Attorney, Agent, or Firm* — Merchant & Gould P.C.

(57) ABSTRACT

The present invention relates to a method for manufacturing high-resolution microfluidic structures by means of the modification of the sealing temperature and photolithography.

8 Claims, 3 Drawing Sheets

METHOD FOR OBTAINING MICROFLUIDIC POLYMER STRUCTURES

FIELD OF THE INVENTION

The present invention is generally comprised within the field of polymer structures and specifically within the field of high-resolution microfluidic polymer structures.

STATE OF THE ART

The first microfluidic structures were developed at the start of the 1990s (Darwin R. Reyes, Dimitri Iossifidis, Pierre-Alain Auroux and Andreas Manz. Micro Total Analysis Systems. 1. Introduction, Theory, and Technology. Anal. Chem. 2002, 74, 2623-2636). These structures were manufactured on substrates such as silicon and glass due to the fact that the techniques for micromanufacturing on these materials were already implemented in the microelectronics industry. Many of these structures are currently being developed for applications in different areas of biotechnology, health sciences, etc. However, silicon and glass have relatively high costs associated to both the material and to the manufacturing processes, taking into account that in many cases these structures are disposable and single-use structures. For this reason, new techniques for manufacturing on biocompatible plastic materials, such as methacrylate (PMMA), polycarbonate (PC) etc. have been developed in the last few years.

To manufacture these microfluidic structures in plastic materials some emergent technologies such as microreplication (hot embossing), laser micromachining (Holger Becker, Laurie E. Locascio "Polymer microfluidic devices" Talanta 56 (2002) 267-287) and sealing at low temperatures have been developed, nevertheless, these replication and sealing technologies have serious limitations due to the rapid deterioration of the micromanufactured molds, the complicated process for demolding them, which seriously limit the final geometry and definition of the micromachined structures replicated in the plastic substrate, as well as their subsequent sealing to create the microfluidic structures. Furthermore, in the specific case of PMMA, the structure sealing temperatures cannot exceed 100° C., which is the glass transition temperature of said plastic.

It is therefore necessary to develop microfluidic polymer structures the resolution of which is not limited by its manufacturing process.

DESCRIPTION OF THE INVENTION

The present invention relates to a method for microfluidic manufacturing polymer structures which, by means of the modification of the sealing temperature and photolithography, produces a high-resolution structure, overcoming the problems existing in the state of the art.

The manufacturing method of the invention comprises the following steps:
a) Depositing a thermosetting polymer photoresin on two independent substrates of biocompatible polymer material,
b) producing certain microchannel conformations on the deposited substrate by means of photolithography at low temperature
c) sealing at low temperature In one particular aspect of the invention, the method for manufacturing microfluidic structures optionally comprises a step prior to step a), wherein metal type components, such as metal lines for example, can be deposited on the substrates of polymer material.

In a particular embodiment, the method for manufacturing microfluidic structures comprises depositing a thermosetting polymer photoresin, preferably an epoxy resin, more specifically SU-8 resin, on two substrates of biocompatible polymer material, for example methacrylate (PMMA) or Zeonex or Zeonor.

In the present invention, when reference is made to SU-8, an epoxy base polymer resin which can be structured by means of photolithography techniques is being referred to, specifically a chloromethyloxirane formaldehyde 4,4'-(1-methylethylidene)bis-phenol polymer.

The thermosetting photoresin can be deposited on the substrates of polymer materials by means of spinning depositing techniques. These techniques are based on depositing liquid phase materials in a rotating plate. By means of the rotation of the plate the material is uniformly deposited on the entire substrate.

Once the thermosetting polymer photoresin has been deposited on the polymer substrates, photolithography is carried out at low temperature. In a particular embodiment, the photolithography is carried out at temperatures below the glass transition temperature of the polymer, preferably at temperatures below 90° C. The photolithography starts with illuminating the areas which must form the microstructures. In a particular embodiment, the illumination is with ultraviolet light.

The material exposed to the light then hardens. In a particular embodiment, the material is hardened by means of thermal treatment. The areas which have not been exposed to the light are subsequently developed to define the microchannels. In a particular embodiment, the development is a chemical development, the chemical development particularly comprises the use of an oxygenated solvent, such as propylene glycol monomethyl ether acetate, for example.

Once the photolithography has ended, the obtained wafers are sealed at low temperature. In a particular embodiment, the sealing is carried out at temperatures below the glass transition temperature of the polymer, preferably at temperatures below 95° C.

The use of low temperatures in the photolithography steps for depositing and microstructuring SU-8 on the PMMA wafers and in the bonding processes allows creating an aligned three-dimensional microfluidic lattice between the polymer substrates, which allows forming complex structures between both substrates which are useful for micromixing microfluidic applications.

The components obtained by means of this manufacturing process can withstand pressures of up to 500 KPa without loss of liquid.

The use of molds is not necessary by means of using this manufacturing process, therefore a microfluidic structures with a better quality than those obtained by micromodulating is obtained and the manufacturing costs are reduced. Due to the fact that SU-8 has excellent surface electrokinetic properties, it easily allows flow conduction through the microchannel network, therefore the use of crystal substrates is not necessary, thereby reducing costs.

Given that the processes are carried out at low temperature and the materials used (PMMA and SU-8) have excellent optical properties, these microfluidic structures are useful for being used together with other electronic and optical components integrated in the same substrate.

DETAILED DESCRIPTION OF AN EMBODIMENT

The method of the present invention is based on the use of photolithography and sealing techniques at temperatures below 90° C. of thermosetting polymer materials (SU-8) (U.S. Pat. No. 4,882,245, Nov. 21, 1989) which allow manufacturing very high resolution (1-500 microns wide, 20-100 microns high and approximately 1 meter long) microfluidic structures on a biocompatible polymer substrate, for example on PMMA. This process does not require micromolds for manufacture and is based on the deposit and photolithography at low temperature on two polymer substrates (PMMA) of layers of the thermosetting polymer SU-8 photoresin and a subsequent bonding of the two layers in a process carried out at low temperatures.

The different manufacturing steps, optimization of the bonding process for forming the microchannels and the fluidic characterization thereof are described below.

Figure 1:
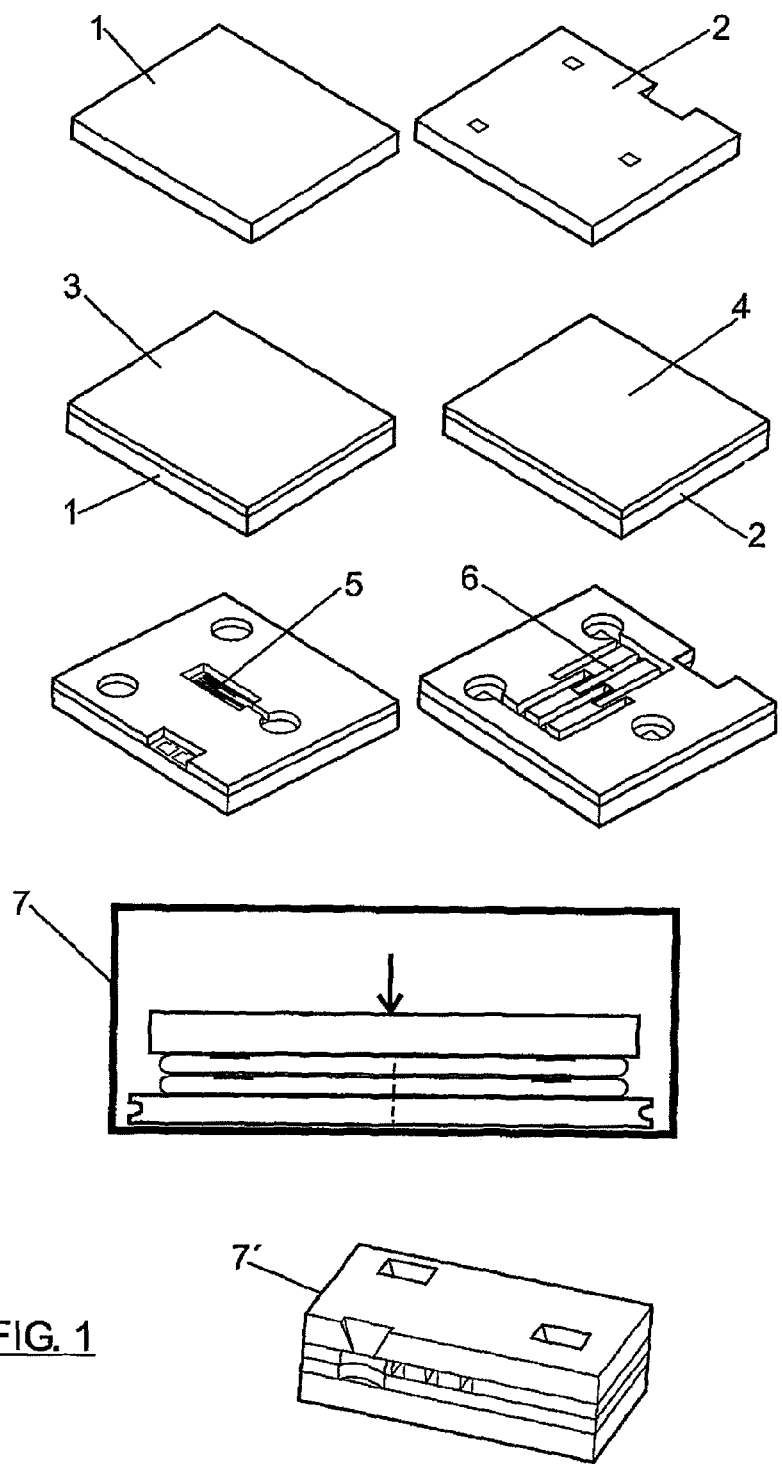
FIG. 1 is a diagram of the manufacturing process of the invention.

The manufacturing process of the invention began with depositing the SU-8 photoresin by means of spinning techniques in two PMMA wafers 1 and 2, FIG. 1. This process was carried out on a rotating plate which allowed uniformly spinning the SU-8. The SU-8 was deposited on the PMMA substrates and then the plate was rotated. This process was carried out in two steps, a first step for 5 seconds at 600 revolutions per minute (r.p.m.) with an acceleration of 200 r.p.m./second and a second one of 5000 r.p.m. and with an acceleration of 600 r.p.m./second for 60 seconds. As a result, the SU-8 was uniformly deposited on the entire substrate, forming respective layers 3 and 4, with a thickness of 20 microns, which were then subjected to a thermal process (soft bake) at a temperature of 85° C. for 7 minutes in a flat hot plate. The temperature of the plate was increased up to 85° C. using a step of 6° C./minute. The solvent residues that were not eliminated during the deposit evaporated in this process and the deposited resin became uniform. Once the thermal process has finished, the deposited polymer was microstructured using standard photolithography techniques.

The photolithographic structuring process began with an ultraviolet illumination process in a contact aligner (standard Suss MA6 photolithography equipment). Only the areas where the microstructures (microchannels) will be formed once the process has finished were exposed to ultraviolet light through a mask placed in the aligner. The ultraviolet dose that was used was 150 mJ/cm$^2$. Then a thermal treatment was performed which hardened (polymerized) the SU-8 of the exposed areas at a temperature between 86-88° C. for 3 minutes in the flat hot plate. The step at which the temperature was increased from room temperature was 6° C./minute. Once hardened, the non-exposed areas were chemically developed such that microchannels 5 and 6 were defined on SU-8. This development was performed with the standard SU-8 photoresin developer (propylene glycol monomethyl ether acetate, PGMA) for 3 minutes. The non-exposed parts were eliminated during development, leaving structures of 20 microns in height on the PMMA substrate. Once the manufacturing process had ended, these structures were established as the guides for the microchannels 5 and 6.

The entire photolithographic process was carried out at temperatures below the glass transition temperature of the PMMA polymer which in this case was calculated by means of Differential Scanning Calorimetry (DSC) techniques and was 101° C. Due to the nature of the photolithographic process, these microchannels were aligned in the PMMA wafers without any problems with substrate deformation and with a 1 micron resolution, the photolithographic mask aligner (Suss MA6) resolution.

Once the channels 5 and 6 were defined, both substrates were superimposed and bonded together by means of a modified sealing process. The standard sealing process for sealing SU-8 resin with itself is carried out at a temperature of 100° C. (F J Blanco, M Agirregabiria, J Garcia, J Berganzo, M Tijero, M T Arroyo, J M Ruano, I Aramburu and Kepa Mayora. Novel three dimensional embedded SU-8 microchannels fabricated using a low temperature full wafer adhesive bonding. Journal of Micromechanics and Microengineering 14 (2004) 1047-1056), which makes it incompatible with PMMA. The process was modified to make the necessary temperatures and pressures compatible with the substrate (PMMA). FIG. 1 shows the diagram of the manufacturing process. This process was performed in a commercial bonding tool 7 (Suss SB6 Bonder). Since PMMA can withstand a maximum temperature of 101° C., the bonding process temperature was lower (90° C.) because if pressure is applied during the bonding process at a temperature that is close to the glass transition temperature, PMMA can melt and become deformed by the applied pressure and collapse the SU-8 channels previously defined in the photolithographic process. FIG. 3 (electron microscope photograph) shows an example of a microchannel 8, FIG. 2, manufactured in SU-8 and collapsed due to the yield of PMMA during the bonding process. This process was performed at a temperature of 95° C. and a pressure of 300 KPa.

Figure 4:
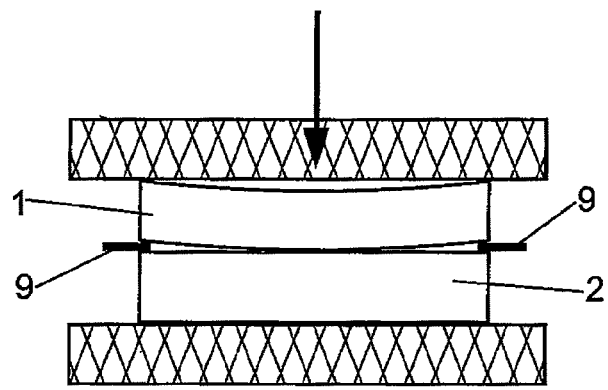
FIG. 4 shows the bonding process for obtaining the structure of the invention.

A wafer bonding protocol using commercial bonding equipment was established to prevent this problem, and this protocol allowed performing the bonding at a lower temperature and pressure. First the wafers were aligned in the Mask aligner (MA6) and were then transferred to the bonding chamber separated by spacers. FIG. 4 shows a diagram of the wafers separated by spacers 9, FIG. 4. The bonding chamber was subsequently evacuated at 10$^{-3}$ mbar. Before contact, two heaters (in the bottom and in the upper part) uniformly heated the wafers at a temperature of 85° C. for 3 minutes, allowing the moisture to evaporate and preventing any empty formation. The wafers were then put in contact with one another and heating of the wafers began at a temperature of 90° C., applying a pressure of 100 KPa for 20 minutes. The problem of folding (inclination, curve) was prevented using these low temperatures and pressures and a finished product 7' was obtained.

The process described in the present invention allows introducing other components in the devices, such as metal lines for example, because they would not be damaged due to the low temperatures used both in the photolithography and in the sealing.

Figure 2:
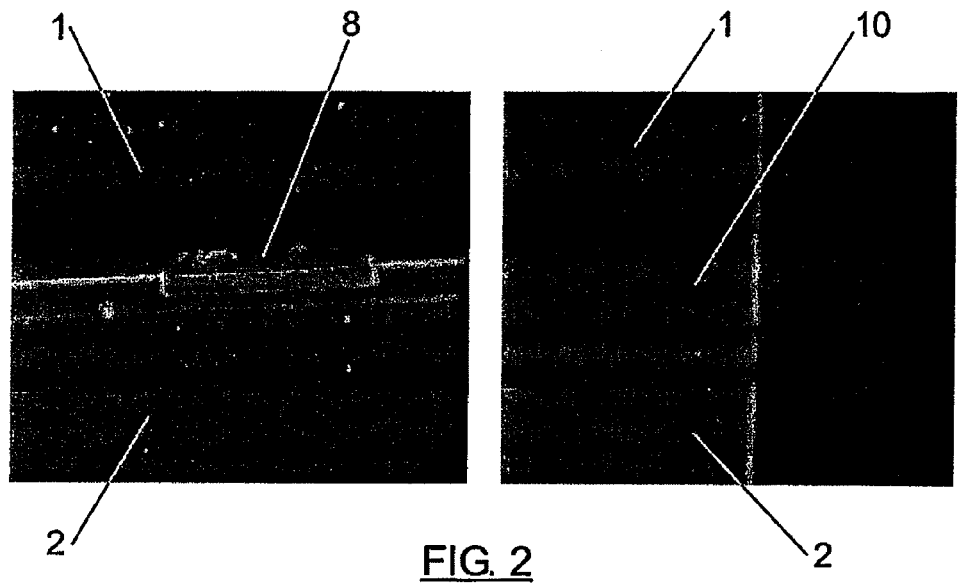
FIGS. 2 and 3 are microphotographs showing sections of a structure obtained with the method of the invention.
Figure 3:
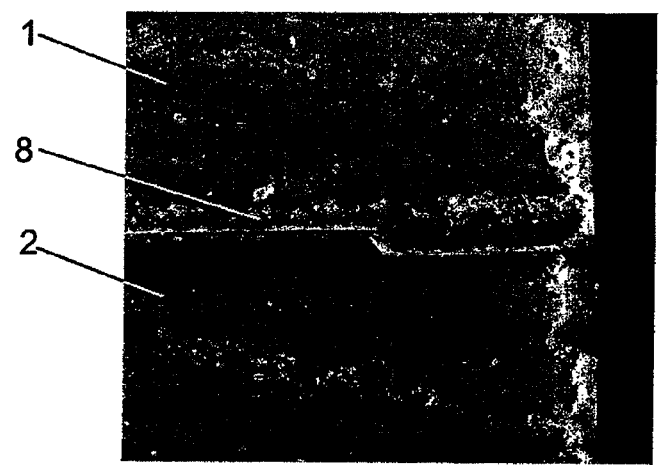

The result was rectangular microchannels 8 that were well defined in comparison with other technologies for manufacturing microfluidic polymer devices (FIG. 2). The right side of FIG. 2 shows the interface 10 of the layers of SU-8 between the two PMMA substrates 1 and 2.

Figure 5:
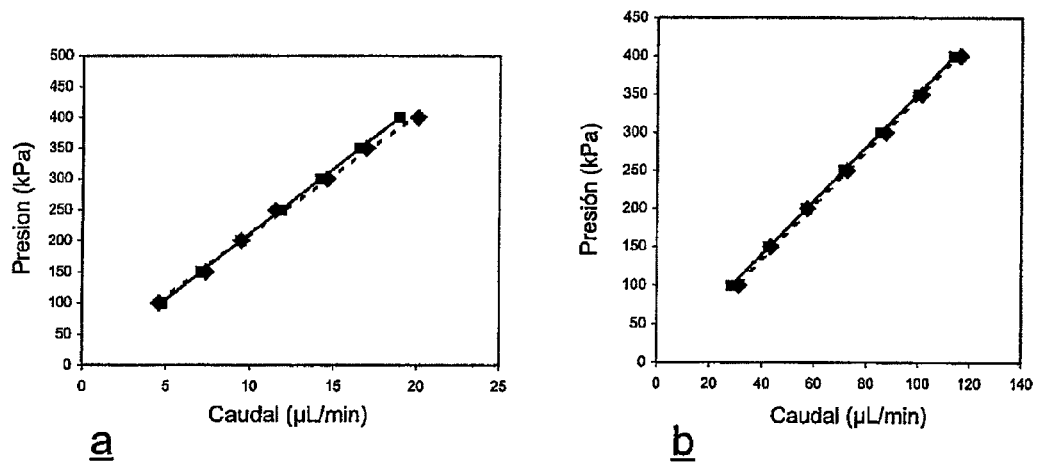
FIGS. 5a and 5b show diagrams in which experimental flows and theoretical predictions for channels with different sections are shown.

The microchannels 8, obtained by the manufacturing method described in the present invention were tested with liquids for their fluidic characterization, showing excellent sealing as seen in FIGS. 2 and 3, where the result of the flow of the passage of water with injection pressures from 100 to 500 Kpa, through microchannels of 20 microns in height, and between 150 and 50 microns wide, respectively, is observed. The solid line in FIG. 5a shows the theoretical results provided by the macroscopic theory of fluid mechanics, whereas the dotted line represents the experimental flows at different injection pressures for a channel 50 microns wide and 20 microns high.

The invention claimed is:

1. A method for manufacturing microfluidic structures comprising:
   a) depositing a thermosetting polymer photoresin on two independent substrates of biocompatible polymer material
   b) performing photolithography on the surface of the deposited photoresin at low temperature, below the glass transition temperature of said biocompatible polymer material, to form microchannels
   c) sealing the obtained wafers, by means of superimposing them, facing one another by the surface with the photoresin, at temperatures below the glass transition temperature of the polymer material and applying pressure.

2. The method according to claim 1, comprising, before step a), depositing metal-type components on the substrates.

3. The method according to claim 1, wherein the deposited polymer photoresin is an epoxy resin.

4. The method according to claim 1, wherein the deposited polymer photoresin is a chloromethyloxirane formaldehyde 4,4'-(1-methylethylidene)bis-phenol polymer.

5. The method according to claim 1, wherein the substrate of biocompatible polymer material is PMMA.

6. The method according to claim 1, wherein the polymer photoresin is deposited on the substrates of biocompatible polymer material by means of spinning.

7. The method according to claim 1, wherein the photolithography is performed at temperatures less than 90° C.

8. The method according to claim 1, wherein the sealing is performed at temperatures less than 90° C.

* * * * *